(12) United States Patent
Jung et al.

(10) Patent No.: US 8,050,092 B2
(45) Date of Patent: Nov. 1, 2011

(54) NAND FLASH MEMORY WITH INTEGRATED BIT LINE CAPACITANCE

(75) Inventors: Chulmin Jung, Eden Prairie, MN (US); Harry Hongyue Liu, Maple Grove, MN (US); Brian Lee, Eden Prairie, MN (US); Yong Lu, Edina, MN (US); Dadi Setiadi, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 242 days.

(21) Appl. No.: 12/474,463

(22) Filed: May 29, 2009

(65) Prior Publication Data

US 2010/0302849 A1    Dec. 2, 2010

(51) Int. Cl.
*G11C 11/34* (2006.01)
*G11C 11/24* (2006.01)

(52) U.S. Cl. ............... 365/185.08; 365/149; 365/185.17
(58) Field of Classification Search ............... 365/185.08
See application file for complete search history.

(56) References Cited

U.S. PATENT DOCUMENTS

| | | | |
|---|---|---|---|
| 5,455,786 A * | 10/1995 | Takeuchi et al. | 365/145 |
| 5,623,442 A * | 4/1997 | Gotou et al. | 365/185.08 |
| 5,768,208 A * | 6/1998 | Bruwer et al. | 365/228 |
| 6,198,652 B1 * | 3/2001 | Kawakubo et al. | 365/145 |
| 6,201,733 B1 * | 3/2001 | Hiraki et al. | 365/185.08 |
| 6,528,839 B2 * | 3/2003 | Shukuri et al. | 257/314 |
| 6,992,928 B2 * | 1/2006 | Inoue | 365/185.08 |
| 7,180,787 B2 * | 2/2007 | Hosono et al. | 365/185.24 |
| 7,319,613 B2 | 1/2008 | Forbes | |
| 7,333,363 B2 * | 2/2008 | Nakai et al. | 365/185.08 |
| 7,397,686 B2 | 7/2008 | Takashima et al. | |
| 7,414,888 B2 * | 8/2008 | Yeh | 365/185.17 |
| 7,417,893 B2 | 8/2008 | Bhattacharyya et al. | |
| 7,508,707 B2 * | 3/2009 | Nakai et al. | 365/185.08 |
| 7,697,333 B2 * | 4/2010 | Isobe | 365/185.11 |
| 7,782,683 B2 * | 8/2010 | Sohn et al. | 365/189.2 |
| 7,859,899 B1 * | 12/2010 | Shakeri et al. | 365/185.08 |
| 7,872,919 B2 * | 1/2011 | Tanaka et al. | 365/185.21 |

* cited by examiner

*Primary Examiner* — Son Mai
(74) *Attorney, Agent, or Firm* — Fellers, Snider, et al.

(57) ABSTRACT

Method and apparatus for outputting data from a memory array having a plurality of non-volatile memory cells arranged into rows and columns. In accordance with various embodiments, charge is stored in a volatile memory cell connected to the memory array, and the stored charge is subsequently discharged from the volatile memory cell through a selected column. In some embodiments, the volatile memory cell is a dynamic random access memory (DRAM) cell from a row of the cells with each DRAM cell along the row coupled to a respective column in the memory array, and each column of non-volatile memory cells comprises Flash memory cells connected in a NAND configuration.

20 Claims, 5 Drawing Sheets

NAND FLASH MEMORY WITH INTEGRATED BIT LINE CAPACITANCE

BACKGROUND

Data storage devices generally operate to store and retrieve user data in a fast and effective manner. Some data storage devices utilize solid-state memory elements (cells) to store the user data, such as in the case of a solid-state drive (SSD). The memory cells can be volatile or non-volatile, and can take a variety of constructions such as but not limited to dynamic random access memory (DRAM), static random access memory (SRAM), Flash, electrically erasable programmable read only memory (EEPROM), spin-torque transfer random access memory (STRAM), and resistive random access memory (RRAM).

The cells can be programmed to store data in relation to a given programmed state. The programmed state can be sensed by a sense amplifier which senses a voltage drop across the cell responsive to application of a read current. Each cell can be used to store a single bit of user data, or can be used to store multiple bits of user data.

The memory cells can be arranged into an array of rows and columns. The cells in each column can be connected in a NAND configuration, such as in the case of certain types of Flash memory arrays. A page read operation can be carried out to read the contents of the memory cells along a selected row by applying a word line voltage to the selected row while applying read currents to bit lines along each column. In this way, the entire contents of the selected row (a page of memory) can be retrieved from the array. While operable, these and other types of read operations can be time and resource intensive.

SUMMARY

Various embodiments of the present invention are generally directed to a method and apparatus for outputting data from a memory array comprising a plurality of non-volatile memory cells arranged into rows and columns, such as but not limited to a NAND connected Flash memory array.

In accordance with some embodiments, the method generally comprises storing charge in a volatile memory cell connected to the memory array, and discharging said stored charge from the volatile memory cell through a selected column of the array.

In accordance with other embodiments, the apparatus generally comprises a memory array comprising a plurality of non-volatile memory cells arranged into rows and columns, and a row of volatile memory cells connected to the memory array, wherein charge stored in a selected volatile memory cell is discharged from the selected volatile memory cell through an associated column of the memory array.

In accordance with yet further embodiments, the apparatus generally comprises a memory array comprising a plurality of non-volatile memory cells arranged into rows and columns, and first means connected to the memory array for reading respective programmed states of a selected row of the non-volatile memory cells by storing multi-bit data in the form of charge and by subsequently discharging said charge through the memory array.

These and other features and advantages which characterize the various embodiments of the present invention can be understood in view of the following detailed discussion and the accompanying drawings.

DETAILED DESCRIPTION

The present disclosure relates to reading the programmed states of non-volatile memory cells, and in particular to methods and devices that may be used to improve the rate at which the programmed states of the memory cells can be output during a read operation. In accordance with exemplary embodiments, a plurality of non-volatile memory cells are arranged in rows and columns as a memory array. A row of volatile memory cells is added to the memory array, such as but not limited to dynamic random access memory (DRAM) cells. Each cell in the row of volatile memory cells is associated with a respective column in the array of non-volatile memory cells.

Reading data from the memory array can be carried out by writing a selected state to the volatile memory cell of an associated column, which results in the storage of charge by the volatile memory cell. The stored charge is thereafter discharged from the volatile memory cell through the associated column, and the discharged charge is used to sense a programmed state of a selected non-volatile memory cell in the column.

Figure 1:
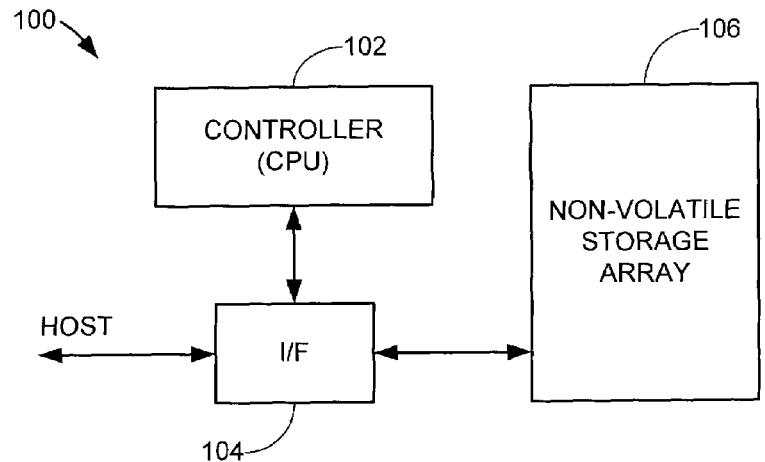
FIG. 1 provides a functional block representation of a data storage device constructed and operated in accordance with various embodiments of the present invention.

FIG. 1 provides a functional block representation of an exemplary data storage device 100. While not limiting, for purposes of the present discussion it will be contemplated that the device 100 is characterized as a solid-state drive (SSD) that utilizes Flash memory cells arranged in a NAND configuration.

The device 100 includes a top level controller 102, an interface (I/F) circuit 104 and a non-volatile data storage array 106. The I/F circuit 104 operates under the direction of the controller 102 to transfer user data between the array 106 and a host device (not shown). In some embodiments, the controller 102 is a programmable microcontroller. Data can be buffered in the I/F circuit 104 pending a transfer of the data between the array 106 and the host device.

Figure 2:
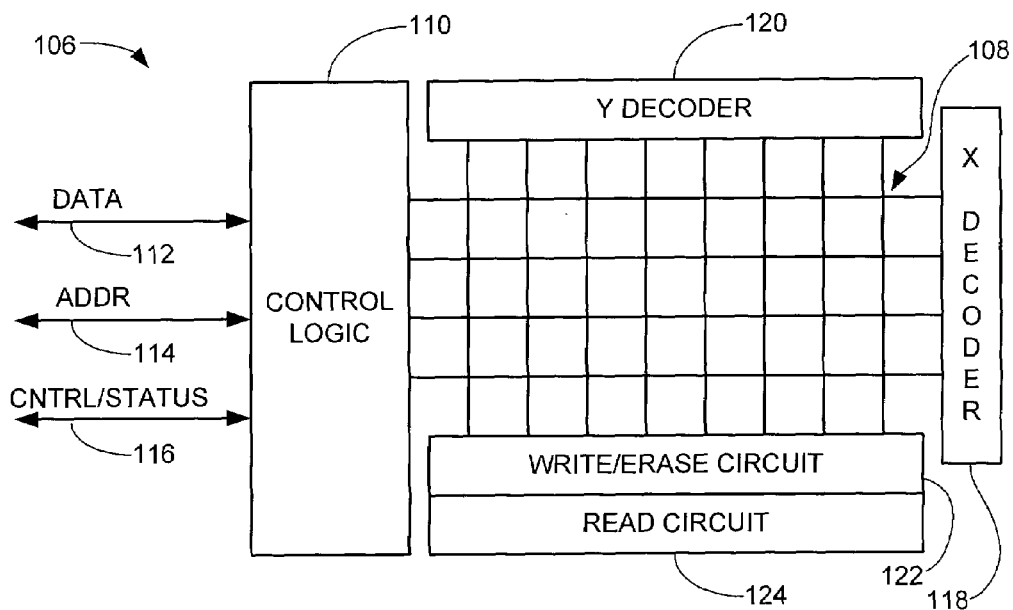
FIG. 2 shows a functional block representation of a portion of the memory array of the device of FIG. 1.

FIG. 2 provides a functional representation of portions of the non-volatile storage array 106. A number of non-volatile memory cells 108 are arranged in rows and columns and controlled by control logic 110 that can transfer data between the array 106 and the I/F 104 (FIG. 1). Data, addressing and control/status signals are transferred via paths 112, 114 and 116, respectively.

The cells 108 are coupled via various control lines to an X (row) decoder 118 and a Y (column) decoder 120. A write/erase circuit 122 operates to carry out write and erase operations with the cells 108. A read circuit 124 operates to carry out read operations with the cells 108. It will be appreciated that the arrangement of FIG. 2 is merely exemplary in nature, as any number of different configurations can be utilized depending on the requirements of a given application.

Figure 3:
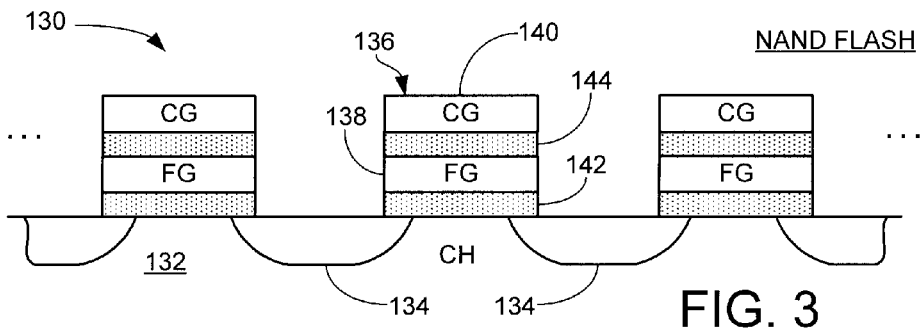
FIG. 3 illustrates a number of memory cells of the array of FIG. 2, which in some embodiments are characterized as non-volatile Flash memory cells arranged in a NAND configuration.

FIG. 3 shows a number of the memory cells 108 of FIG. 2 characterized as Flash memory cells 130 arranged in a NAND configuration. A substrate 132 includes spaced apart, localized doped regions 134. Adjacent pairs of the doped regions 134 are spanned by gate structures 136 each comprising a floating gate (FG) 138, a control gate (CG) 140, and respective insulating oxide layers 142, 144.

The Flash memory cells 130 each substantially operates as a modified n-channel metal oxide semiconductor field effect transistor (MOSFET). Application of a suitable gate voltage to the floating gate (FC) 138 establishes a conductive channel (CH) between the adjacent doped regions 134, thereby generating a drain-to-source conductivity path.

During a programming operation, a write current through the channel results in the passage of charge through the lower oxide layer 142 to the floating gate (FG) 138. The presence of accumulated charge on the floating gate 138 serves to alter the requisite threshold voltage $V_T$ that needs to be applied to the control gate 140 to establish conductivity through the channel. Hence, the Flash memory cell 130 can store different programmed values in relation to different amounts of accumulated charge on the floating gate 138.

Increased amounts of charge can be successively added to the floating gate during subsequent write operations. A separate erase operation is required to remove the accumulated charge from the floating gate and return the floating gate to an uncharged state. An erase operation can be carried out on an entire block of the Flash memory cells at the same time.

While operable as non-volatile storage elements, Flash memory cells such as 130 can have relatively long write programming times (such as on the order of 200 microseconds, μs) and erase times (e.g., around 2 milliseconds, ms), and transfer data at relatively low data throughput rates (e.g., around 20 megabytes per second, MB/s). By comparison, volatile memory cells such as dynamic random access memory (DRAM) can have significantly higher levels of performance, such as no separate erase requirements and data I/O (read/write) rates on the order of 1 gigabytes per second, GB/s or higher.

Accordingly, various embodiments of the present invention are generally directed to a novel memory architecture that can be used to provide a non-volatile memory block with high bandwidth read performance. In some embodiments, a Flash memory is provided with a row of DRAM memory cells. Charge stored in the DRAM memory cells is used to read the programmed states of the Flash memory cells. This can result in a Flash memory block with data transfer rates that approach, or even exceed, those achievable by a DRAM memory array.

Various exemplary embodiments presented herein utilize a combination of Flash and DRAM, although such is merely illustrative and not limiting. Other suitable configurations for the non-volatile memory cells include but are not limited to ferroelectric random access memory (FeRAM), spin-torque transfer random access memory (STRAM) and resistive random access memory (RRAM). Other suitable configurations for the volatile memory cells include but are not limited to various charge storage devices including capacitive and inductive elements, static random access memory (SRAM) and various latches or gate logic.

Figure 4A:
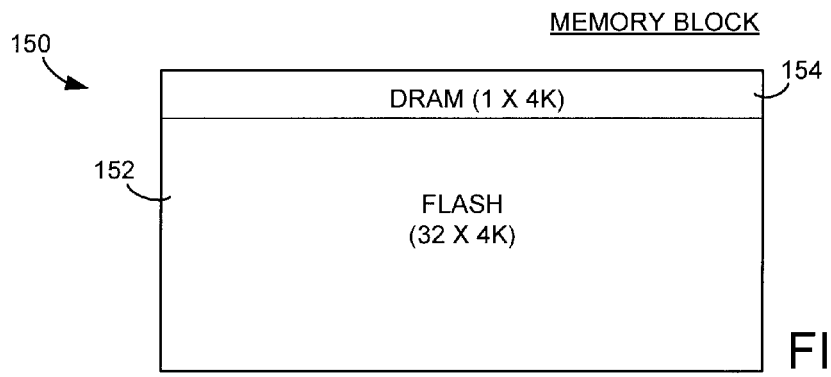
FIG. 4A shows a functional representation of a memory block in accordance with some embodiments.

FIG. 4A shows an embodiment for an exemplary memory block 150 suitable for use in the data storage device 100 of FIG. 1. The block 150 is formed of a non-volatile Flash memory portion 152 and a volatile DRAM portion 154. The non-volatile portion 152 includes Flash memory cells arranged into rows and columns. While any number of sizes can be used, an exemplary size for the portion 152 can be 32 rows by 4096 columns (32×4K). The DRAM portion 154 comprises a single row of 4096 DRAM cells (1×4K). Each DRAM cell is connected to a respective column in the Flash memory portion 152.

Figure 4B:
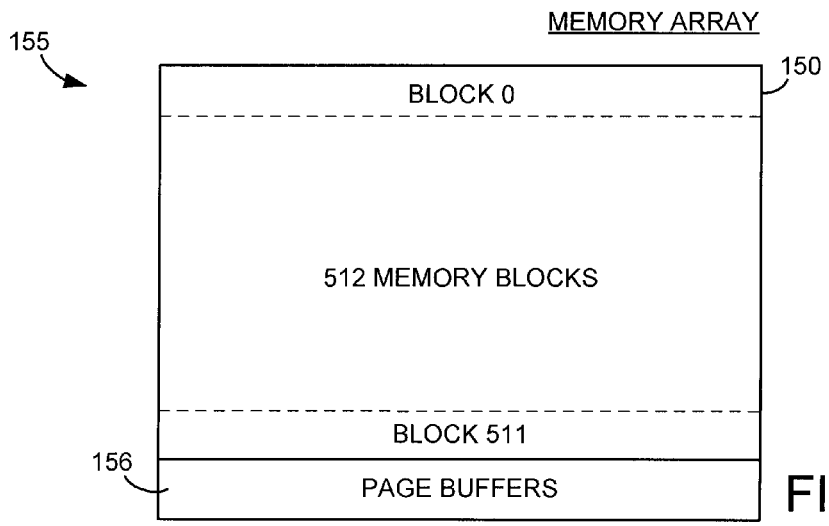
FIG. 4B shows a functional representation of a memory array formed from a number of memory blocks of FIG. 4A.

FIG. 4B shows a larger memory array 155 that can be formed from a number of the memory blocks 150 from FIG. 4A. The array 155 in FIG. 4B is made up of 512 memory blocks 150 (blocks 0 to 511), although other numbers of blocks can be used. Page buffers 156 are used during data transfer operations with the memory blocks 150. As explained below, up to 512 concurrent data operations can be supported with the memory array 155, one for each block 150.

Figure 5:
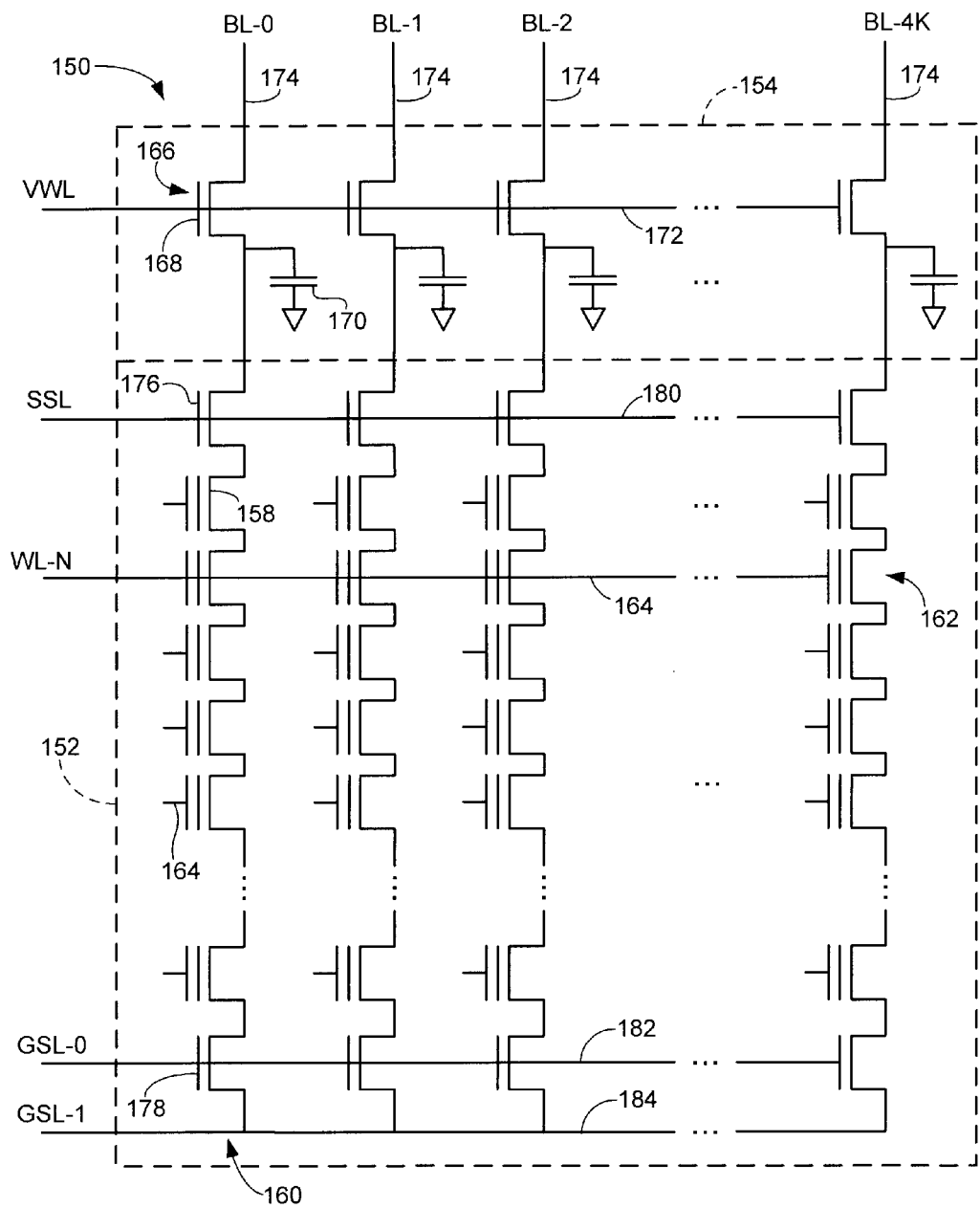
FIG. 5 graphically represents a schematic illustration of portions of the memory block of FIG. 4A in accordance with various embodiments of the present invention.

FIG. 5 shows an exemplary schematic representation of portions of the block 150 of FIG. 4A. The Flash memory portion 152 of FIG. 4A is represented by a relatively large dotted line enclosure in FIG. 5, and is made up of Flash non-volatile memory cells 158. The Flash cells are arranged into columns 160 and rows 162, with the Flash cells 158 connected in a NAND configuration along each column. The Flash cells 158 are further connected along each row 162 via a respective word line 164, such as the exemplary word line WL-N for row N.

The DRAM memory portion 154 of FIG. 4A is represented by a relatively small dotted line enclosure in FIG. 5, and is shown to be made up of DRAM volatile memory cells 166 each comprising a transistor 168 and a capacitor 170. The transistors 168 are connected to a volatile memory cell word line VWL 172. The DRAM cells 166 are respectively connected to the Flash cells 158 in each column 160 along respective bit lines 174. The bit lines 174 are respectively identified as BL-0 to BL-4K.

Upper and lower control transistors (MOSFETs) 176, 178 bound each column 160 as shown. The gates of the upper transistors 176 are connected to a high level source line (SSL) 180, and the gates of the lower transistors 178 are connected to a first low level global source line (GSL-0) 182. The drains of the lower transistors 178 are connected to a second low level global source line (GSL-1) 184.

Read operations can be carried out on a row-by-row basis, so that the programmed states of the non-volatile memory cells 158 along a given row 162 are retrieved in a page mode operation. In accordance with some embodiments, the contents of row N are read by applying a gate control voltage to the word line WL-N with a selected magnitude that will differentiate between the different possible programmed states of the Flash cells 158 along the row.

Depending on the individually programmed states of the various cells, the cells along row N will either transition to a conductive state or remain in a non-conductive state responsive to the applied voltage on WL-N. The remaining word lines 164 receive a second, higher voltage that will ensure that all of the remaining Flash cells 158 in the block 152 will be placed in a conductive state. Suitable voltages are provided to the SSL and GSL-0 lines 180, 182 to place the upper and lower transistors 176, 178 in a conductive state. In some embodiments, the SSL line may be provided with a VCC voltage (e.g., +3V) and the GSL-0 line may be provided with a VSS voltage (e.g., ground). The GSL-1 line may also be set to VSS. The non-selected word lines may be provided with a pass voltage of about +5V.

A voltage source applies the VCC voltage to each of the bit lines BL-0 through BL-4K. As a selected bit line 174 receives the VCC voltage, the capacitor 170 in the DRAM cell 166 will store charge to provide a capacitive voltage. It will be appreciated that the storage of charge in this manner constitutes a programming operation on the DRAM cell 166, and the storage of charge on all of the capacitors 170 can be characterized as the writing of a multi-bit value (e.g., 11111 . . . ) to the row of DRAM cells. Depending on the size of the capacitors 170, the time required to store charge on each capacitor may be on the order of the time required to carry out a normal DRAM write operation.

In some embodiments, all of the bit lines 174 can be supplied with current simultaneously so that all of the DRAM capacitors 170 store associated amounts of charge simultaneously. Alternatively, the voltage source can sequentially apply the requisite charge to each bit line 174 and capacitor 170 in turn.

The charge stored by a selected volatile memory cell 166 is subsequently discharged through the non-volatile memory cells 158 in the associated column. This discharged charge forms a read current that passes through the column, and the sensed voltage across the column generated by this read current can be used to determine the programmed state of the non-volatile cell 158 along the selected row.

It is contemplated that the time required to sense the programmed state of the selected non-volatile cell 158 in a given column may be longer than the time required to charge the capacitor 170 in the volatile memory cell 166 associated with the column. Thus, in at least some embodiments the sensing operation will be initiated while charge is being stored by the capacitor 170 and will continue after the voltage source has been decoupled from the transistor, since the discharge of the stored charge will maintain current passing through the column for the sense operation. In other embodiments, the array can be configured such that the capacitor is initially charged and the sense operation does not commence until after the charging operation is completed. The voltage source can be decoupled from the bit lines in a number of ways, such as individually by upstream switching circuitry or globally by deasserting the VWL word line 172.

Figure 6:
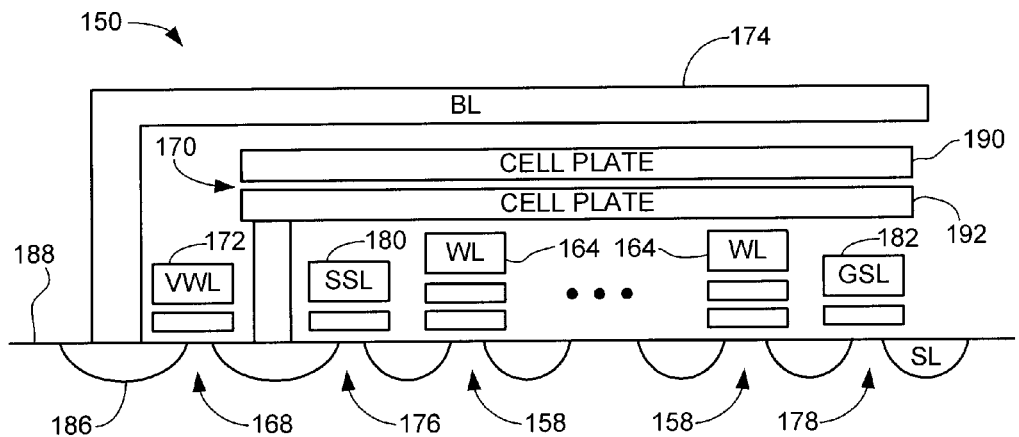
FIG. 6 displays an elevational representation of the schematic of FIG. 5.

FIG. 6 provides an elevational representation of the block 150 of FIG. 5 in accordance with an exemplary construction. A number of localized n+ doped regions 186 are formed in a substrate 188. Adjacent pairs of the doped regions 186 form respective drain and source regions for the respective transistors 158, 168, 176 and 178. The capacitor 170 in each column can be formed from respective cell plates 190, 192 which extend over the column along the length of the column as shown to take a 128 $F^2$ (32×4 $F^2$) size, although other sizes and shapes can be used, including a U shaped set of plates.

In some embodiments, each Flash cell 158 can be configured with a 2.5 $F^2$ sized control gate, 70 angstrom tunneling oxide, and 0.5 ratio, and provided with a capacitance of about 15.8 attofarads, aF ($15.8\times10^{-18}$ F). This provides the 32 Flash cells along each column with a combined capacitance of about 0.505 femtofarads, fF ($0.505\times10^{-12}$ F). The total capacitance along a selected bit line will depend on a number of factors including construction, separation and length.

An exemplary total bit line capacitance value for the block 150 may be on the order of about 136 fF. Thus, using a capacitance for the capacitor 170 that is about one-tenth of this bit line capacitance, i.e. about 13.6 fF for the capacitor 170, may provide a 10 to 1 data I/O performance ratio compared to conventional DRAM. Those skilled in the art will appreciate that a value of about 13.6 fF for the capacitor 170 is relatively small and is readily achievable using a configuration such as in FIG. 6.

Those skilled in the art will appreciate that a read operation on a conventional Flash block can require the application of the pass voltage to the non-selected word lines of each block in turn for a duration of time on the order of about 25 microseconds, μs ($25\times10^{-6}$ s) in order to output 4K (4096 cells) of data. This provides an overall data I/O rate of about 25 μs/4K=20.4 MB/s ($20.4\times10^6$ Bytes/s).

Figure 7:
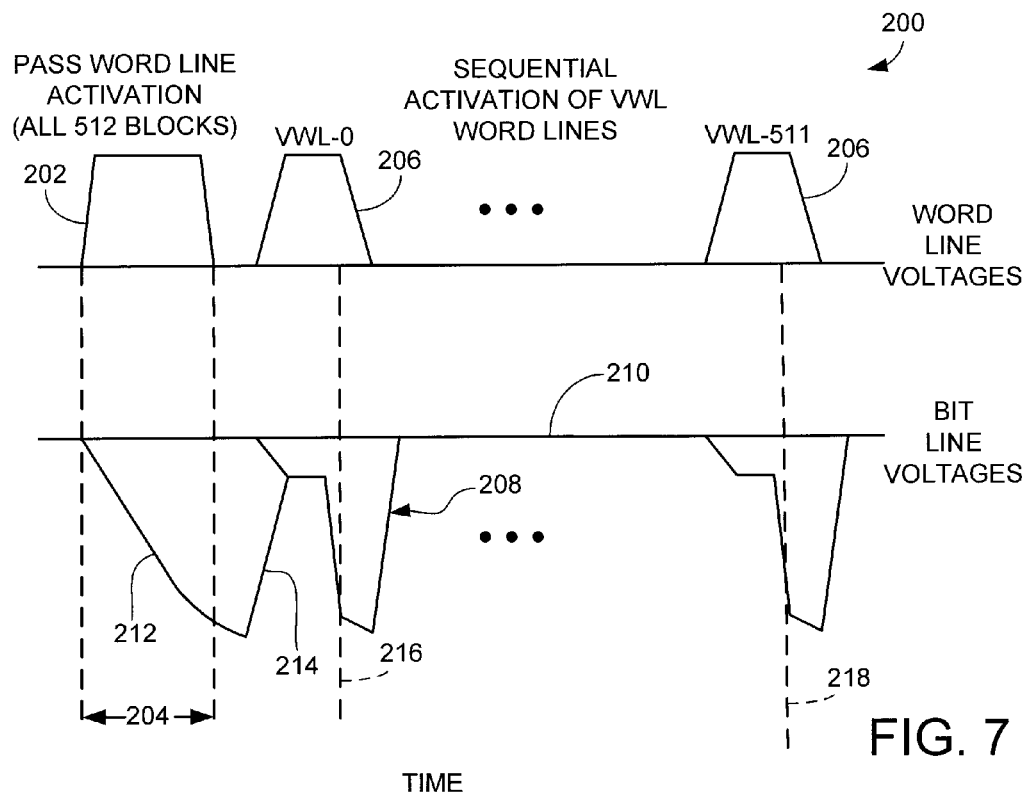
FIG. 7 sets forth a timing diagram for an exemplary read operation carried out in accordance with various embodiments of the present invention.

By contrast, FIG. 7 shows a timing diagram 200 to illustrate a timing sequence for read operations upon the exemplary memory array 155 of FIG. 4B. It will be appreciated that the timing diagram 200 is merely representational and is not necessarily drawn to scale.

An activation pulse is initially represented at 202, and this represents the concurrent assertion of the non-selected word lines (pass word lines) for all 512 blocks 150 in the array 155. The duration of the pulse 202 is represented by the interval 204 and may be on the order of about 200 nanoseconds, ns ($200\times10^{-9}$ s). It is contemplated that the capacitance of the control gates will be sufficient to maintain the non-selected Flash cells in a conductive state throughout the duration of the read operation.

Each of the DRAM VWL word lines (VWL-0 to VWL-511) are next successively asserted in turn, as shown by pulses 206. These pulses result in the charging of the respective capacitors 170 along the respective DRAM rows (portions 154) in each block, and the discharge of the charge stored on the capacitors to the bit lines and through the associated columns. For reference, the pulses 206 in FIG. 7 represent the entire interval of time that each bit line is charged, both initially by the bit line voltage source and subsequently by charge transfer from the DRAM capacitor.

A second curve 208 in FIG. 7 generally represents the associated bit line voltage profile for the respective bit lines during the read operation. In some embodiments, the bit lines may be precharged to a value of ½ VCC (e.g., about 1V), represented by baseline 210. The pass word line activation of pulse 202 results in a decay of the bit line voltage at portion 212, followed by an associated rise portions 214 coincident with assertion of the respective VWL word lines 206. The sensing of data for each block 150 will be completed within the charge/discharge interval as indicated by boundary 216, and the read operation on all 512 blocks will be completed at boundary 218.

In some embodiments, each charge/discharge interval 206 may be on the order of about 30 nanoseconds, ns ($30\times10^{-9}$ s) in duration, with about 10 ns of precharge, 10 ns of hold time, and about 10 ns of charge transfer time after the DRAM word line VWL has been deasserted. These are merely exemplary and other values and ratios can be utilized.

It follows that the reading of a page of data (4K) from a single block can be completed in about 30 ns or less. Since the 512 DRAM word lines VWL-1 to VWL-512 are strobed in succession, it is contemplated that 2.09 MB of data (4K×512) can be output from the Flash array 155 in about 15.36 microseconds, μs (30 ns×512). This is faster than it can take to output a single page of data (4K) from a conventional Flash array, and indeed, is a DRAM compatible transfer rate. Even faster rates may be achievable, and the only limiting factor may be the column speed (response time) of the page buffers 156.

Figure 8:
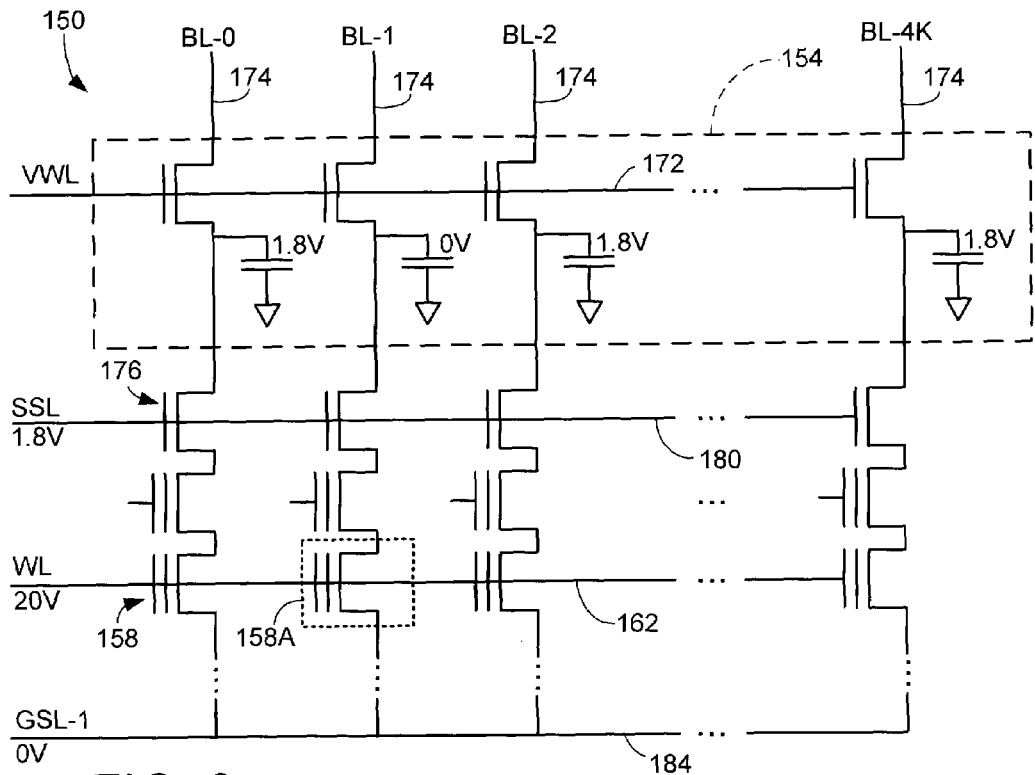
FIG. 8 illustrates an exemplary write operation on a selected memory block.

The volatile memory cells (e.g., DRAM cells 166) can further be used to facilitate write (programming) operations upon the non-volatile memory cells (e.g., Flash cells 158). As shown in FIG. 8, a programmed state can be written to a selected Flash memory cell 158A with the application of a suitable write voltage to the associated word line 162, such as 20V, and the assertion of the SSL and GSL lines 180, 184 with 1.8V and 0V. The bit line for the selected cell 158A (in this case, BL-1) is set to 0V and the remaining bit lines are set to 1.8V.

In this way, the desired programmed state will be provided to the selected Flash cell 158A while the non-selected cells 158 will fail to receive enough voltage to alter their existing states. It should be noted that the various voltages and magnitudes are not limiting and can be a variety of values depending on the requirements of a given application. A column of the Flash memory cells 158 can be erased in a conventional manner.

Figure 9:
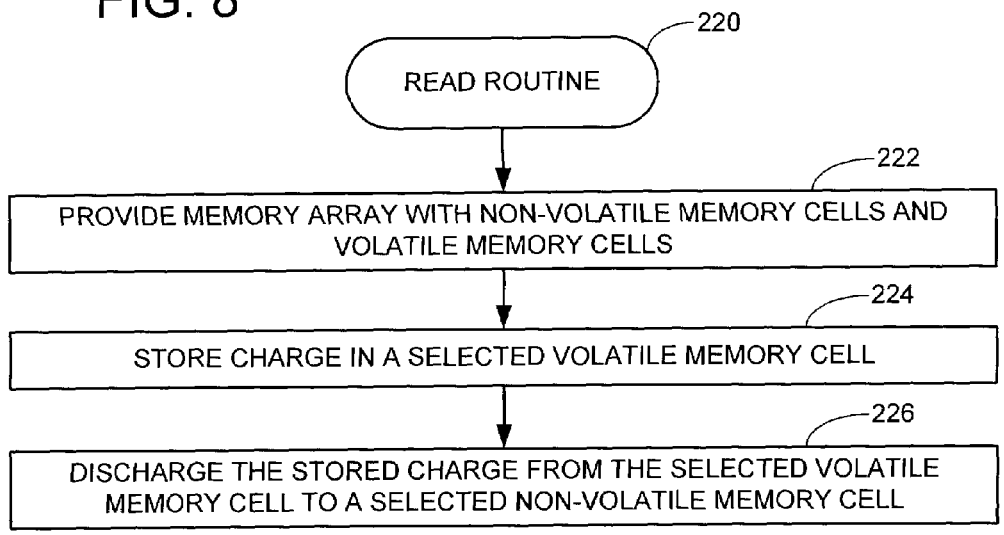
FIG. 9 provides a flow chart for an exemplary read routine generally illustrative of steps carried out in accordance with various embodiments of the present invention.

FIG. 9 provides a flow chart for a DATA READ routine 220 to summarize various aspects of the foregoing discussion. A memory array is provided at step 222 with both non-volatile memory cells and volatile memory cells, such as the exemplary Flash cells 158 and DRAM cells 166 discussed above, although this is not limiting. Charge is stored in a selected volatile memory cell at step 224, and this stored charge is discharged from the volatile memory cell to a selected non-volatile memory cell at step 226. Such discharge can be used to sense the programmed state of the non-volatile memory cell.

As can be appreciated by one skilled in the art, the various embodiments illustrated herein provide advantageous reading of data from a memory array in an efficient manner. The use of both volatile and non-volatile memory cells to store and output data provides increased data throughput and long term storage. Moreover, the presence of a capacitor or other charge storage device allows data to be outputted without the presence of an external voltage and a more rapid successive access to individual blocks of memory cells. It will be appreciated that the various embodiments discussed herein have numerous potential applications and are not limited to a certain field of electronic media or type of data storage devices.

For purposes herein, the references to rows and columns will be read broadly as relational identifiers in an ordered array of elements along different axes without constituting a specific physical layout. Thus for example, the term "row" may constitute a physical column and "column" may constitute a physical row.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method of outputting data from a memory array comprising a plurality of non-volatile memory cells arranged into rows and columns, the method comprising:
   storing charge in a volatile memory cell connected to the memory array;
   precharging at least one column to a predetermined non-zero voltage after the charge is stored in the volatile memory cell; and
   discharging said stored charge from the volatile memory cell through a selected column of the non-volatile memory cells.

2. The method of claim 1, wherein the discharging step further comprises using the discharged charge to sense a programmed state of a selected non-volatile memory cell in the selected column.

3. The method of claim 1, further comprising asserting a volatile cell word line coupled to the volatile memory cell during the using step to store said charge in a capacitor of the volatile memory cell, and asserting a plurality of non-volatile word lines each respectively coupled to a different non-volatile memory cell in the selected column to discharge said charge from the capacitor through the selected column.

4. The method of claim 1, wherein a voltage source is coupled to a capacitor of the volatile memory cell to store said charge during the storing step, and wherein the voltage source is decoupled from the capacitor during the discharging step.

5. The method of claim 1, comprising a prior step of providing a row of said volatile memory cells adjacent the memory array of non-volatile memory cells, wherein each volatile memory cell is respectively coupled to a different column of said non-volatile memory cells.

6. The method of claim 5, wherein the volatile memory cells are characterized as dynamic random access memory (DRAM) cells, and wherein the non-volatile memory cells along each column in the memory array are characterized as Flash memory cells connected in a NAND configuration.

7. The method of claim 1, wherein the non-volatile memory cells along each column in the memory array comprise Flash memory cells connected in a NAND configuration.

8. The method of claim 1, wherein additional charge is stored in a second volatile memory cell coupled to a second selected column of the memory array during the discharging step.

9. The method of claim 1, wherein a row of non-volatile memory cells is coupled to the memory array with each memory cell connected to a respective column.

10. The method of claim 9, wherein said charge stored in the volatile memory cell provides a capacitance voltage of selected magnitude, and wherein a capacitance voltage of said selected magnitude is respectively applied to each of the volatile memory cells during a page mode read operation in which a selected row of the non-volatile memory cells is read.

11. An apparatus, comprising:
    a memory array comprising a plurality of non-volatile memory cells arranged into rows and columns; and
    a row of volatile memory cells connected to the memory array, wherein charge stored in a selected volatile memory cell is discharged from the selected volatile memory cell through an associated column of the memory array, the selected volatile memory cell having a capacitor disposed between the non-volatile memory cells and a bit line of the associated column, the capacitor cantilevered over at least two non-volatile memory cells along a length of the associated column.

12. The apparatus of claim 11, wherein a read circuit uses the discharged charge to sense a programmed state of a selected non-volatile memory cell in the associated column.

13. The apparatus of claim 11, wherein assertion of a volatile cell word line coupled to the row of volatile memory cells couples a voltage source to the capacitor of the selected volatile memory cell to store said charge on the capacitor, and wherein the voltage source is decoupled from the capacitor during the discharge of said charge through the associated column.

14. The apparatus of claim 11, wherein a plurality of non-volatile cell word lines are asserted while the charge is discharged from the volatile memory cell through the associated column, each non-volatile cell word line in said plurality being coupled to a different one of the non-volatile memory cells in said associated column.

15. The apparatus of claim 11, wherein charge is respectively stored in each of the volatile memory cells and subsequently discharged therefrom through the respective columns of the memory array to read respective programmed states of the non-volatile memory cells along a selected row of the memory array.

16. The apparatus of claim 11, wherein the volatile memory cells are characterized as dynamic random access memory (DRAM) cells, and wherein the non-volatile memory cells along each column in the memory array are characterized as Flash memory cells connected in a NAND configuration.

17. The apparatus of claim 11, wherein additional charge is stored in a second selected volatile memory cell along the row of volatile memory cells while charge is discharged from the selected volatile memory cell through the associated column.

18. The apparatus of claim 11, wherein said charge stored in the selected volatile memory cell provides a capacitance voltage of selected magnitude, and wherein a capacitance voltage of said selected magnitude is respectively applied to each of the volatile memory cells along said row during a page mode read operation in which a selected row of the non-volatile memory cells is read.

19. An apparatus comprising:
a memory array comprising a plurality of non-volatile memory cells arranged into rows and columns; and
first means connected to the memory array for reading respective programmed states of a selected row of the non-volatile memory cells by storing multi-bit data in the form of charge and by subsequently discharging said charge through the memory array, the charge stored in at least one capacitor disposed between the non-volatile memory cells and a bit line of an associated column, the capacitor cantilevered over at least two non-volatile memory cells along a length of the associated column.

20. The apparatus of claim 19, wherein the first means comprises a row of volatile memory cells connected to the memory array, wherein charge stored in a selected volatile memory cell is discharged from the selected volatile memory cell through the associated column of the memory array.

* * * * *